United States Patent [19]
Chen et al.

[11] Patent Number: 5,882,740
[45] Date of Patent: *Mar. 16, 1999

[54] METHOD OF PRODUCING DIAMOND OF CONTROLLED QUALITY AND PRODUCT PRODUCED THEREBY

[75] Inventors: Chia-Fu Chen, Hsinshu City, Taiwan; Kazuhito Nishimura, Osaka, Japan; Ensei Ko, 835-2, Nishi Koiso, Oiso-machi, Naka-gun, Kanagawa-ken, Japan; Hiroshi Ishizuka, Tokyo, Japan; Satoru Hosomi, Kanagawa-ken, Japan

[73] Assignees: Ishizuka Research Institute Ltd.; Ensei Ko, both of Kanagawa-ken; Osaka Diamond Industrial Co., Ltd, Sakai, all of Japan

[*] Notice: The term of this patent shall not extend beyond the expiration date of Pat. No. 5,510,157.

[21] Appl. No.: 627,320

[22] Filed: Apr. 1, 1996

Related U.S. Application Data

[63] Continuation-in-part of Ser. No. 789,441, Nov. 6, 1991, Pat. No. 5,510,157, which is a continuation of Ser. No. 494,750, Mar. 16, 1990, abandoned.

[30] Foreign Application Priority Data

Mar. 17, 1989 [JP] Japan .................................. 1-067228
Mar. 31, 1989 [JP] Japan .................................. 1-083378

[51] Int. Cl.$^6$ ................................................. C01B 31/06
[52] U.S. Cl. .......................................... 427/577; 423/446
[58] Field of Search ........................... 423/446; 427/249, 427/577

[56] References Cited

U.S. PATENT DOCUMENTS

| | | | |
|---|---|---|---|
| 3,630,679 | 12/1971 | Angus | 423/446 |
| 4,767,608 | 8/1988 | Matsumoto et al. | 156/DIG. 68 |
| 4,932,331 | 6/1990 | Kushoa et al. | 423/446 |
| 4,985,227 | 1/1991 | Ito et al. | 423/446 |
| 5,114,696 | 5/1992 | Purdes | 423/446 |
| 5,474,021 | 12/1995 | Tsuno et al. | 423/446 |
| 5,510,157 | 4/1996 | Chen et al. | 423/446 |

FOREIGN PATENT DOCUMENTS

| | | | |
|---|---|---|---|
| 288065 | 10/1988 | European Pat. Off. | 423/446 |
| 213612 | 12/1983 | Japan | 423/446 |
| 62-223075 | 3/1986 | Japan | 423/446 |
| 2070295 | 3/1987 | Japan | 425/446 |
| 67228/89 | 3/1989 | Japan . | |
| 83378/89 | 3/1989 | Japan . | |

OTHER PUBLICATIONS

Yokota et al, "Effect of Doping With Nitrogen and Boron on Cathodo–Luminescene of CUD Diamond", Mot. Res. Symp. Proc. vol. 162 pp. 231–236 1990 No Month.

*Primary Examiner*—Michael Lewis
*Assistant Examiner*—Stuart L. Hendrickson
*Attorney, Agent, or Firm*—Larson & Taylor

[57] ABSTRACT

A method is provided for efficiently producing an entirely quality-controlled CVD diamond. A CVD process is interrupted at an early stage and the deposit is taken out of the reaction chamber, before a significant mass is accumulated, and is inspected by means of cathodoluminescence. The spectrum are compared with a given reference in terms of peak position, half width and 20%-value width in coordination. The observed deviation allows to determine whether to maintain or alter the settings.

A diamond substance of acceptable quality which is properly specified in terms of the CL parameters is also provided.

20 Claims, 6 Drawing Sheets

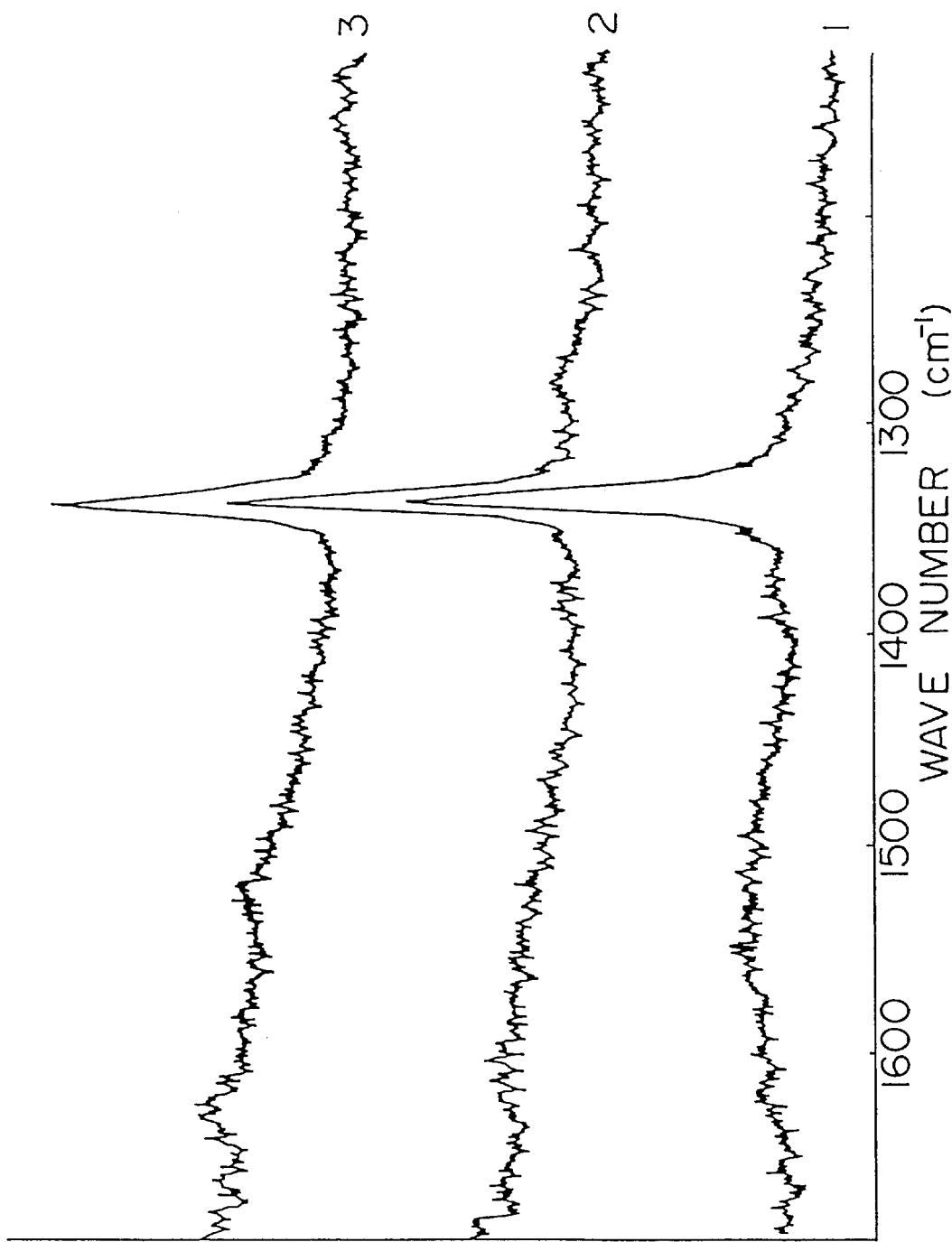

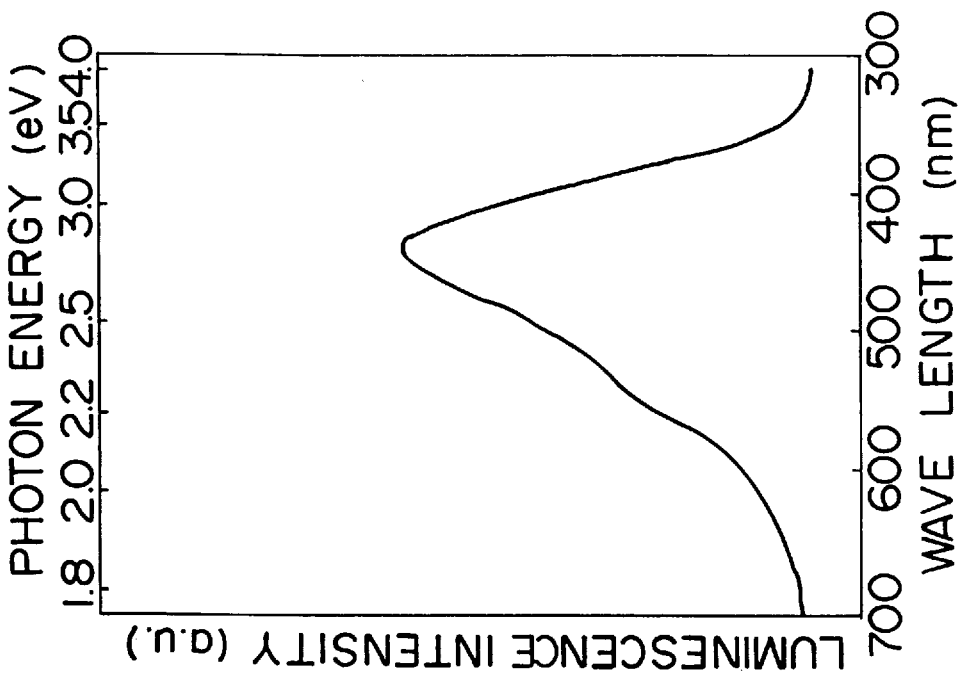
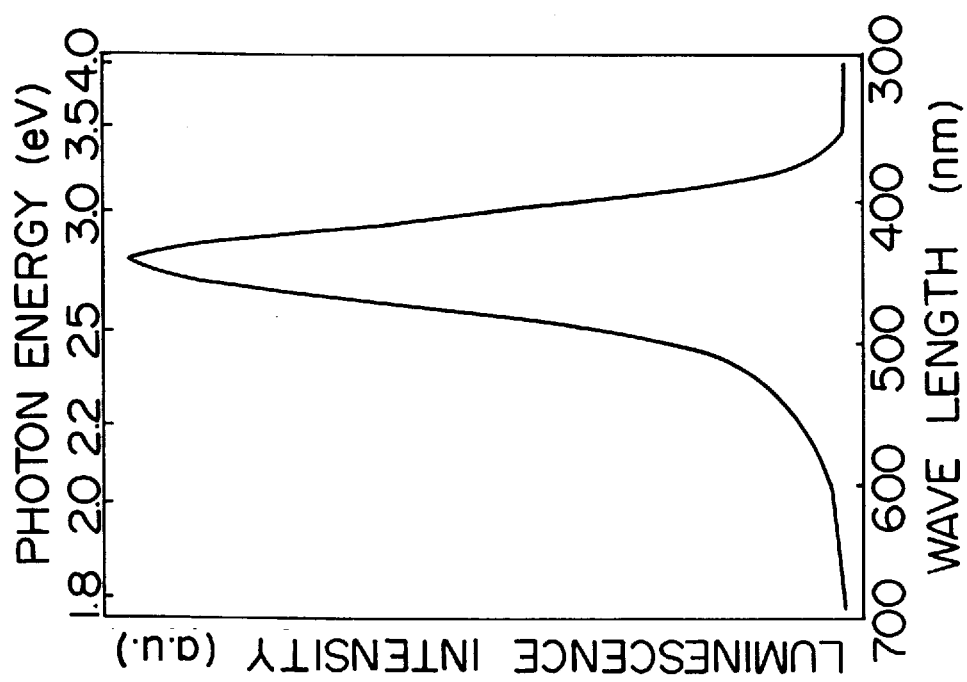

METHOD OF PRODUCING DIAMOND OF CONTROLLED QUALITY AND PRODUCT PRODUCED THEREBY

This application is a continuation-in-part of application Ser. No. 07/789,441 filed Nov. 6, 1991, now U.S. Pat. No. 5,510,157, which was a continuation of U.S. Ser. No. 07/494,750 filed Mar. 16, 1990, now abandoned.

This invention relates to a method of producing diamond or diamond-like substance (simply referred to as "diamond" hereinafter) of crystallographic acceptable quality by chemical vapor deposition (CVD). The invention also relates to such products, in film or particles, of, for example, type IIa or IIb which are adaptable to optical or electronic applications as well as other advanced technology.

CVD Diamond synthesis processes, in which a matrix gas containing a carbonaceous material such as hydrocarbon, ketone and alcohol, is activated by micro- or RF wave induction or heat radiation and diamond is deposited therefrom, are in general easier to adjust operation parameters and can produce wider area of products than high pressure techniques. Thus there is possibility of depositing a wear resistant coating on tools and, further, producing better controlled crystallographical quality to a degree that the diamond materials would find applications in optics and electronics among others.

It is desired that diamonds, for use in such advanced technology, should exhibit crystallographical and physical properties controlled properly so it can be well adapted to specific uses. Thus diamond as a material of heat sink, optical window or semiconductor should exhibit minimal levels of both impurity concentration and structural disorder in order to secure the best thermal, optical or electrical properties. On the other hand, a diamond imparted with consistent semiconducting or electrical properties will be favored as a wear resistant material of electronic instruments.

Diamond and diamond-like products by CVD processes are commonly studied and evaluated by X-ray diffraction or Raman spectrum; the former appears to be suitable essentially for the identification as diamond, while the latter, for detecting amorphous carbon. These techniques are not effective for examining the crystallographical completeness of the deposit.

Several works evidence that crystallographically complete diamonds can be prepared at rates up to several tens of micro-meters per hour, by minimizing contamination by co-depositing graphite or amorphous carbon or due to substrate material, matrix gas, or material of any electrode or heating device used inside the reaction chamber for exciting the matrix gas.

Although fluctuations in some parameters, such as the composition, pressure and temperature of matrix gas may occur and cause an increase in contaminant level or structural disorder, they are often significant to end uses but beyond the detection limits for the standard techniques of X-ray diffractometry or Raman spectroscopy. Then the product quality can be and commonly is estimated and judged only indirectly by checking the consistency in such process parameters as the gas flow, power input and pressure on the meters.

Also it is known that diamond can be imparted with conductivity or semiconductivity by adding a boron metal or compound dopant to the flux material for a high pressure process or a hydrate dopant to the matrix gas for a CVD process. As there has been no method, however, available for inspecting and properly evaluating a small mass of diamond to see if the quality criteria is met for the specific use. Instead the quality can be only checked by actually testing after a sufficient mass of the product has been accumulated.

On the other hand CL (cathodoluminescence) technique is used for the examination and classification of raw natural diamonds by the levels of impurity concentration and structural disorder, as the luminescence which occurs when a diamond specimen is irradiated with an electron beam carries information on the structural deficiency, growth layer distribution, and some other crystallographical structural features. The principle and practice of the technique is specifically described in the Synthetic Diamond Techniques Handbook, pp. 232-, published by Science Forum, Japan (1989).

The Inventors have found that the crystallographical completeness and electrical property and, especially, conductivity are revealed by some parameters of an optical CL spectrum record, which is acquired from a CVD diamond substance.

Based on this finding, an object of the present invention is to provide a method of efficiently producing an entirely quality-controlled CVD diamond by inspecting the product and comparing with the reference in terms of CL spectrum and, accordingly, optimizing and maintaining the process.

Another object is to provide a method of producing type IIa diamond by CVD.

Another object is to provide a method of producing semiconducting type IIb diamond.

Another object is to provide an improved method of characterizing synthetic diamond.

FIGS. 2 and 3 show, respectively, the CL- and Raman spectroscopic results for the diamond products formed at different pressure levels.

FIGS. 4 and 5 show the reproduction of CL spectrum records for the products of invention and reference, respectively, while

Figure 1:
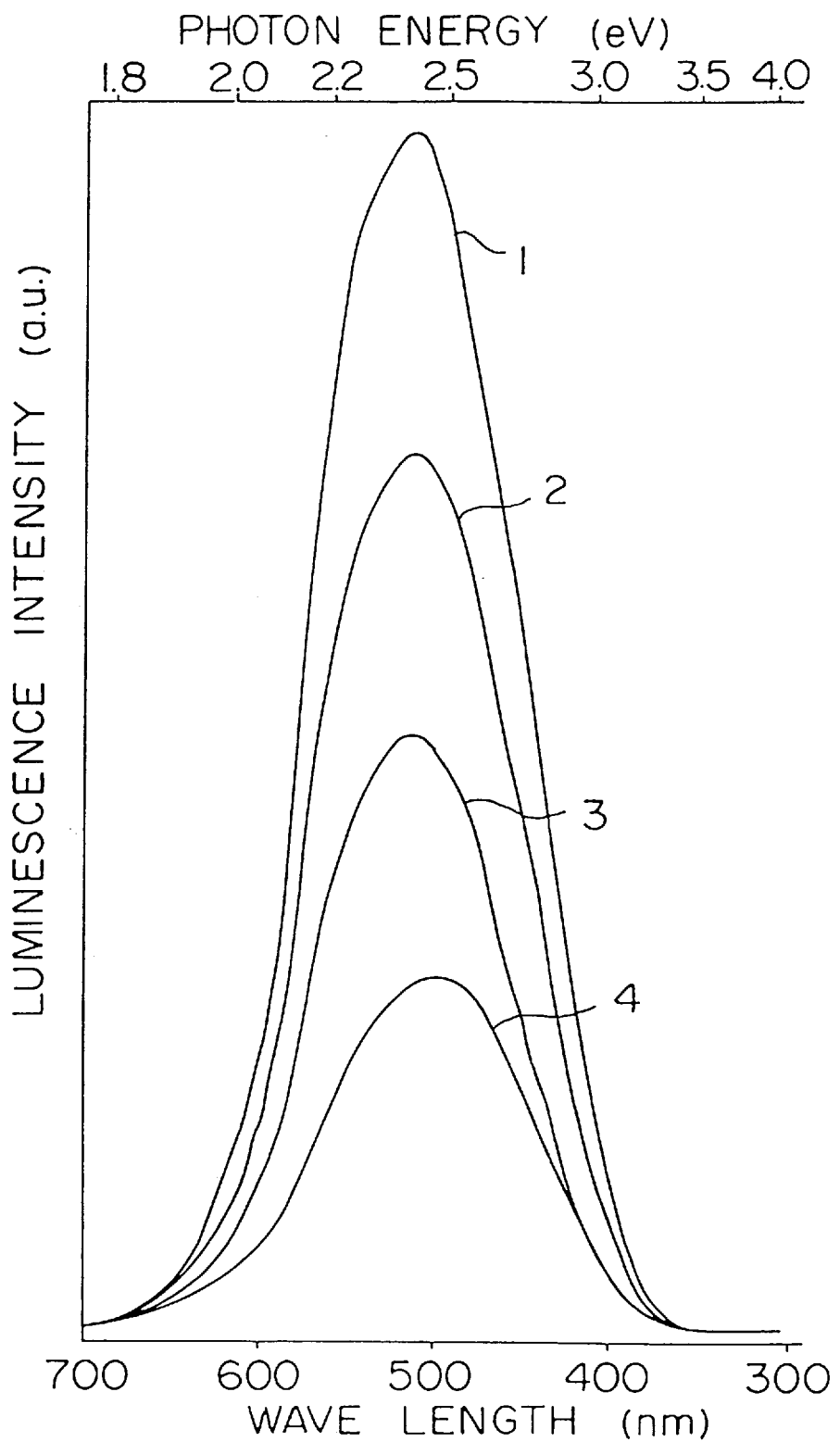
FIG. 1 shows the variation of CL spectrum with boron dopant concentration of CVD diamond.

In the invention matrix gases of various compositions can be used for producing type IIa and other quality, and either $H_2$—CO or $H_2$-hydrocarbon, such as $H_2$—$CH_4$, system can be used without or with a minor proportion of additives such as $O_2$, $CO_2$ and $H_2O$.

$H_2$—$CH_4$ systems may be either simple binary, or based on those gases and comprise further component or components. The binary matrix gas may comprise up to 1 part of $CH_4$ relative to 100 parts of $H_2$ on volume basis per unit time, while the more-component matrix should better comprise at least 1 part of $CH_4$. For other hydrocarbons, the matrix gas should be so composed in a carbon to hydrogen ratio greater than 2/100.

Addition of oxygen containing materials, such as $O_2$, $CO_2$ and $H_2O$ singly or in combination, are effective as a non-diamond carbon etching additive for higher hydrocarbon concentration matrix gases. They are particularly effective for depositing purified diamond at sufficient rates if used at a proper atomic ratio, which is greater than 2/100 for $CH_4$, for example, of the so added oxygen to hydrogen. An addition at least of 1.5 parts of $O_2$, 1 part of $CO_2$ or 2 parts of $H_2O$ has been found particularly effective for achieving a high deposition efficiency.

$H_2$—CO systems also are used either as binary or more complicated composition based on those gases with further component or components. At a lower CO concentration up to 15 parts relative to 100 parts of $H_2$ on volume basis per unit time, the matrix gas can be used as binary as it effectively deposits a diamond of good quality without significant crystallographic defects or graphite inclusion. Use of non-diamond carbon etching additives, such as $O_2$, $CO_2$ and $H_2O$ singly or in combination, are effective with higher CO concentration matrix gases for depositing purified diamond at sufficient rates. The proper atomic ratios of oxygen so added to hydrogen are 5/100 and more. An addition at least of 3 parts of $O_2$, 5 parts of $CO_2$ or 5 parts of $H_2O$ has been found particularly effective for achieving a high deposition efficiency.

Diamond products are subjected to the CL evaluation in the process of growth once or, if necessary, at times in an early stage before a significant mass is deposited. It appears practical that the process is interrupted and the product is transferred to the CL examination chamber, since there is a significant difference in the both chamber arrangement and operating pressure between the examination and deposition.

The CL evaluation, which itself takes less than 20 minutes, can be done conveniently by image analyzing the spectrum record and comparing with a reference spectrum in terms of parameters such as the wave length (and intensity value, if desired) of the peak, half- and 20%-value width, which are defined as the difference between two wave length or photon energy values corresponding to half and 20% the peak value of CL intensity, respectively.

Type IIa diamond is favored for uses as heat sink and optical window materials, for example. This kind of product can be characterized approximately with a CL spectrum with the only peak at about 2.8 eV or more, as well as half- and 20%-value width of or less than 0.5 and 0.8 eV, respectively.

The CL examination is so sensitive: in an instance a CL spectrum could detect a flaw by shoing an. increase to 0.9 eV in 20%-value width due, apparantly, to the superimposition of an emission of band A or H3 center with an idiomorphic, or well faceted, diamond, which was deposited and identified completely as diamond by XRD and Raman spectroscopy.

A semiconducting type IIb diamond can be deposited from the matrix gas containing further dopant additive or additives, such as $B_2H_6$, $H_2S$, $PH_3$, $AlH_3$, HCl, $AsH_3$ or $H_2Se$. The resulting diamond exhibits a spectrum which varies significantly with the level of electrical conductivity and, thus, dopant concentration. Thus FIG. 1 shows the spectrum variation for a boron doping with $B_2H_6$. Here luminescence intensity in arbitrary unit (ordinate) is plotted against either photon energy in eV or wave length in nm (abscissa). Curves 1 to 4 refer to matrix gas flows (per minute) and boron to carbon proportion of 199 ml of $H_2$+20 ml of CO, 20 p.p.m. of boron,
195 ml of $H_2$+20 ml of CO, 100 p.p.m. of boron,
175 ml of $H_2$+20 ml of CO, 500 p.p.m. of boron, and
150 ml of $H_2$+20 ml of CO, 1000 p.p.m. of boron, respectively. The product characteristics are checked by comparing with the reference spectrum parameters. In order to be a type IIb diamond they should show a peak at a photon energy of 2.4 to 2.5 eV, while the half- and 20%-value width be within 180 and 150%, the specification for the type IIa, or 0.9 and 1.2 eV, respectively.

Figure 2:
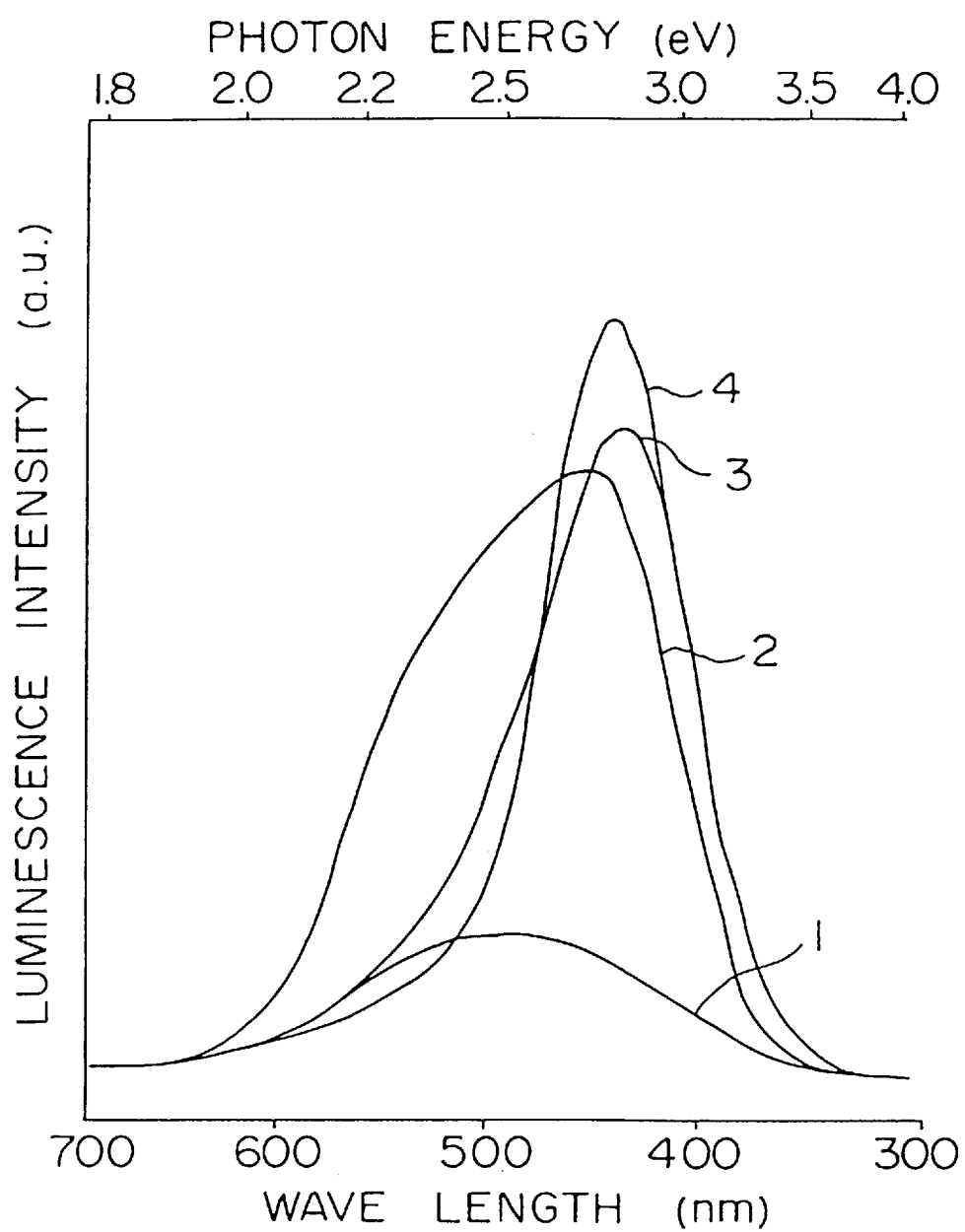

CL spectroscopy is also sensitive and effective for detecting pressure variation which occurs during the process. FIG. 2 as well as the table below show the variation of spectra with pressure from 3.3. down to 1.3 KPa, where curves 1 to 4 refer to the cases of 1.3, 2.0, 2.7 and 3.3 KPa, respectively, while FIG. 3 shows Raman spectroscopic results, with curves 1 to 3 referring to the cases of 1.3, 2.0 and 2.7 KPa, respectively. As FIG. 2 and the table indicate, the product quality lowers steeply with decreasing pressure, there is little difference in Raman records in FIG. 3 for the same specimens.

| Pressure KPa | Peak position eV | Half-value width eV | 20%-value width eV |
|---|---|---|---|
| 3.3 | 2.83 | 0.51 | 0.81 |
| 2.7 | 2.82 | 0.60 | 1.03 |
| 2.0 | 2.74 | 0.84 | 1.12 |
| 1.3 | 2.52 | 0.90 | 1.22 |

In the above description the 20%-value width is employed as a characterizing parameter; it may be obvious, however, that the "20%" level can be replaced, if necessary, with a comparable level of, say, 18 or 25%.

In a process of the invention, a diamond substance of acceptable quality is prepared this way: a conventional substrate of, typically, silicon is placed and positioned properly in a chemical vapor deposition chamber. A CVD process is initiated by introducing a matrix gas to the chamber, heating with a magnetron or by another standard technique and exciting the gas to create a plasma and cause deposition of diamond substance on the substrate, which is heated to at least 500° C., and preferably 700° C. or more.

The process is interrupted once in the most favorable case or more commonly in repetition at an early stage after commencing said deposition before a significant mass of the diamond substance has been deposited on the substrate. The product is removed as carried on the substrate from the chamber and then subjected to the cathodoluminiescence measurement, whereby the luminescence spectrum of the product is determined and compared with the reference spectrum of given acceptable quality in terms of peak position in photon energy or wave length, half-value width and 20%-value width. If there is no appreciable deviation from the reference, the product is placed back in the chamber, and the process is resumed by depositing on it and can be completed with the process conditions unchanged. No further examination is indispensable. However if there is a significant deviation, a new deposition process has to be started, with modified conditions, readjusted toward possible better settings of matrix gas composition, substrate temperature, gas pressure, etc. in order to compensate the deviation. Substrate replacement is not always necessary, since, when the sample diamond is sufficiently small, the poor quality does not essentially affect the later CL inspections. Anyway use of a renewed substrate is preferable.

Thus the deposit may be taken from the deposition chamber 30 minutes, for example, after the commencing of the process, and regularly at times during the process and cathodoluminescence examination is carried out.

If the initial spectrum record meets given criteria, the process can be resumed and continued as decided that the process has been going properly; if not, parameters have been wrong and are modified and adjusted so that the spectrum comes closer to the reference. Such initial checking saves time and cost by preventing from going through an eventual wasteful process until a significant mass of deposit has been produced. Process reproducibility for repeated runs can also be checked by the CL inspection at early stages.

Resulting product quality depends essentially on the process parameters employed, including deposition rate. Thus later inspections by CL allow to readjust and optimize the settings in order to maintain the desired quality.

While activation and excitation of matrix gas from outside by micro- or RF wave is preferable for the minimal use in the deposition chamber of materials to possibly contaminate product, an electroresistive element, such as tungsten filament, can also be placed inside the chamber if used at temperatures sufficiently low.

The substrate temperature should not exceed 950° C. for preventing contamination by diffusion of the material. However a temperature less than 500° C. results in an unfavorably slow deposition. Practically, temperatures between 800° and 900° C. are preferable.

EXAMPLE 1.

A 10×10 mm sheet of silicon was scratched with diamond powder, placed on a carrier of circular quartz 15 mm across, and then raised to the position, in the quartz tube of 48 mm diameter at the center.

While passing a mixed gas of composition listed in the table below (given in parts relative to 100 parts of $H_2$ on volume basis), a 2.45 GHz microwave was transmitted from the magnetron, which was operating at 220 W, to the chamber to heat the substrate to 900° C. Pressure was maintained at about 3.3 KPa in the chamber by controlled degassing. The product quality evaluation is compared in the table, as well as the deposition rate.

Figure 6:
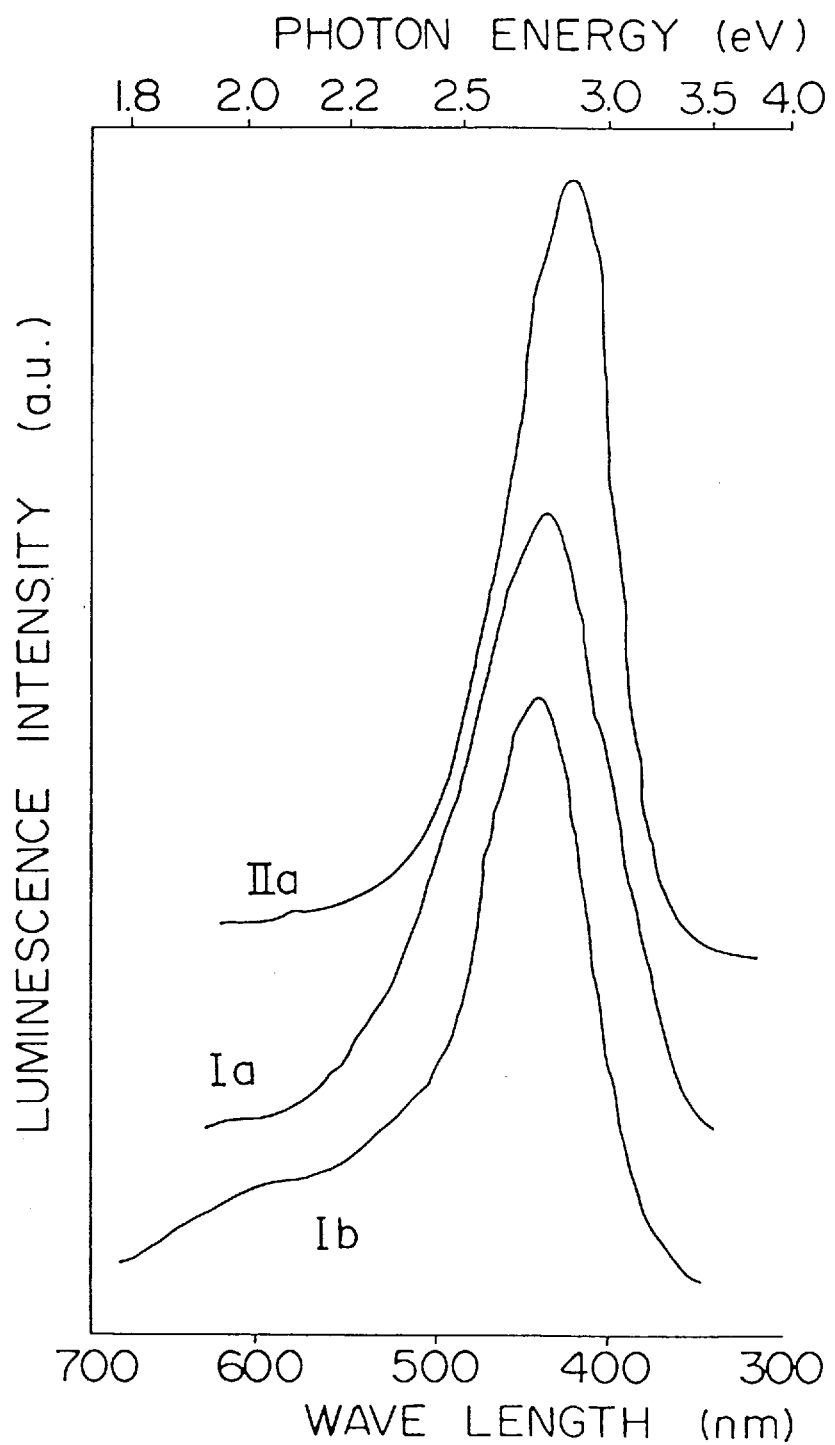
FIG. 6 shows CL spectra for different types of natural diamond.

FIGS. 4, 5 and 6 show the CL spectra taken with a JSM 840 SE microscope for a product of the invention (run no. 6), and a reference product (run no. 10) and a natural diamond, respectively. The ordinate represents luminescence intensity (in arbitrary unit) and the abscissa, photon energy (eV) or wave length (nm).

Figure 7:
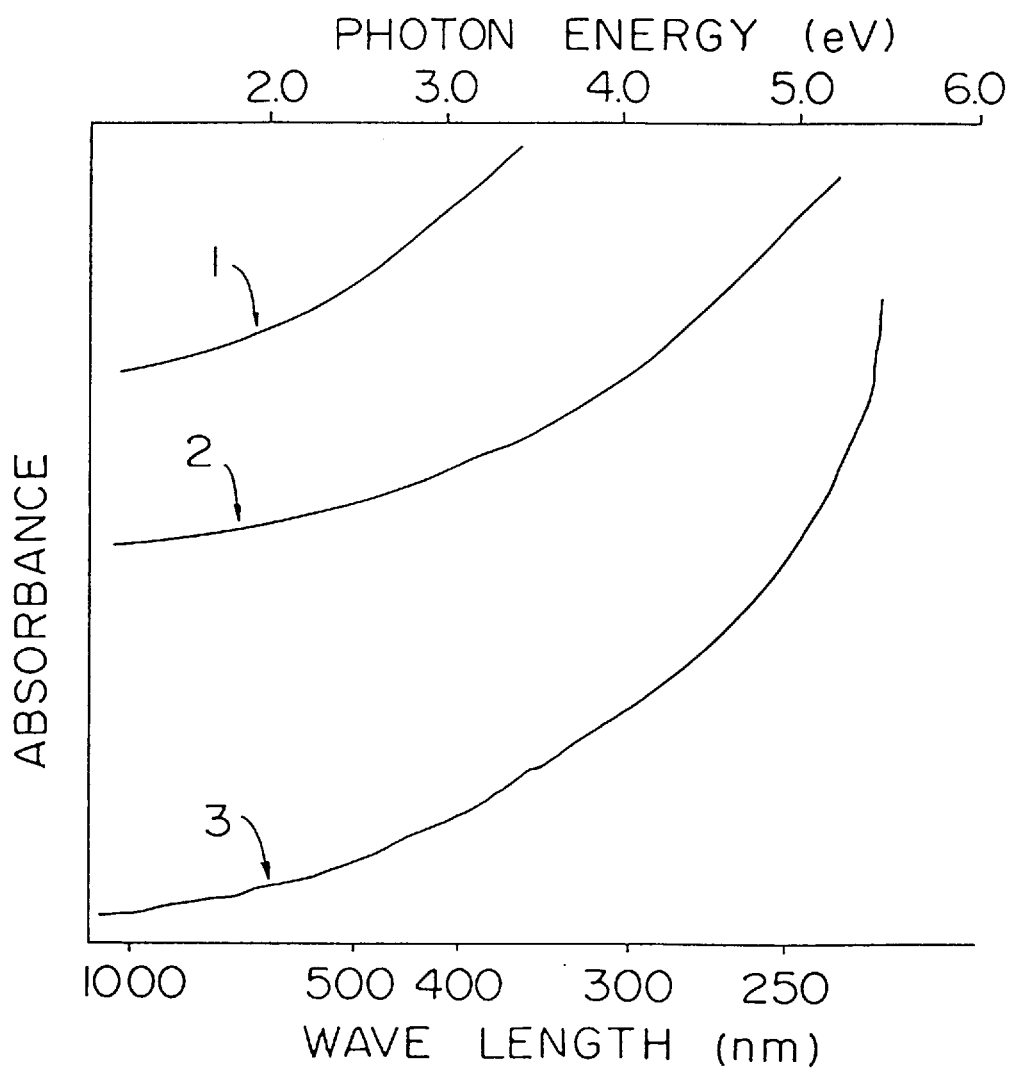
FIG. 7 shows absorbance of another product of invention, reference and type IIa natural diamond.

FIG. 7 compares optical absorption between invention (run no. 6) and reference (no. 7) products and a type IIa natural diamond, where absorbance is plotted against wave length (nm). The figure indicates that the invention product (curve 2), like the natural type IIa (curve 3), transmits a light of wave length in the vicinity of 300 nm. In contrast, the reference product, as a type Ia diamond, absorbs a light of wave length less than 350 nm as curve 1 indicates.

| Run No. | Matrix gas composition | | | | Deposition rate | CL parameters | | |
|---|---|---|---|---|---|---|---|---|
| | $CH_4$ | CO | $O_2$ | $CO_2$ | μm/hr | Peak | HVW | 20% VW |
| invention | | | | | | | | |
| 1 | 0.6 | — | — | — | 0.4 | 2.80 | 0.5 | 0.8 |
| 2 | 3 | — | 1.5 | — | 0.9 | 2.80 | 0.45 | 0.70 |
| 3 | 3 | — | — | 2 | 1.4 | 2.83 | 0.5 | 0.65 |
| 4 | — | 10 | — | — | 1.0 | 2.83 | 0.45 | 0.75 |
| 5 | — | 50 | 4 | — | 1.5 | 2.80 | 0.43 | 0.70 |
| 6 | — | 50 | — | 7 | 2.5 | 2.80 | 0.45 | 0.60 |
| reference | | | | | | | | |
| 7 | 1.2 | — | — | — | 0.7 | 2.80 | 0.80 | 1.00 |
| 8 | 3 | — | — | — | 1.4 | 2.75 | 1.1 | 1.35 |
| 9 | — | 30 | — | — | 1.5 | 2.80 | 0.60 | 0.95 |
| 10 | — | 50 | — | — | 2.0 | 2.80 | 0.85 | 1.35 |

EXAMPLE 2.

A same arrangement as in example 1 was used with a similar substrate, which was heated to about 830° C. 100 ml of $H_2$, 3 ml of $CH_4$ and 3 ml of CO per minute were begun to be supplied in mix at a pressure of 3.3 KPa. 30 minutes later, the product was taken out of the chamber and diagnosed by CL spectrum, and compared with the standard spectrum. Having met the specification of a peak position of 2.8 eV or more, the half- and 20%-value width not exceeding 0.8 eV and 1.2 eV, respectively, the process was continued for further 3 hours to complete a diamond film.

EXAMPLE 3.

The cycle as in the above examples was repeated with the same arrangement. 100 ml of $H_2$ and 3 ml of $CH_4$ per minute were begun to be supplied in mix at a pressure of 3.3 KPa. 30 minutes later, the product was taken out of the chamber and examined. The CL spectrum showed a peak position of 2.80 eV, a half- and 20%-value width of 0.60 and 0.95 eV, respectively. With the both width values too large by 0.10 and 0.20 eV, respectively, in reference with the type IIa criteria in spite of the peak position criterion met, the matrix gas composition is modified by adding 1.5 parts of $O_2$ and the process is resumed. After another 30 minutes of the process, the product was taken out and inspected again. The both width values now cleared the requirement and the process was continued for further three hours to complete the process and, as a result, a 10 micron thick diamond film was obtained.

EXAMPLE 4.

The same arrangement as above was used with similar substrate, which was heated to about 900° C. 100 ml of $H_2$, 50 ml of CO and 4 ml of $CO_2$ per minute were begun to be supplied in mix at a pressure of 3.3 KPa. 30 minutes later, the product was diagnosed by CL spectrum, and compared with the standard spectrum. Meeting the specification of the peak position at 2.7 eV or more, the half- and 20%-value width not exceeding 0.5 eV and 0.9 eV, respectively, the process was continued for further 5 hours to form a 10 micron thick diamond film.

EXAMPLE 5.

The same arrangement as above was used but that a type Ia natural diamond was used as a substrate, which was heated to about 900° C. 200 ml of $H_2$ and 1 ml of $CH_4$ per minute, added with $B_2H_6$ to a B/C ratio of 100 p.p.m., were begun to be supplied in mix at a pressure of 3.3 KPa. Process parameters were maintained such that the deposit spectrum exhibits a peak position between 2.40 and 2.45 eV, a half- and 20%-value width not exceeding 0.75 and 1.1 eV. The product of 5 micron thick film with a bluish color, typical to the type IIb diamond, exhibited a resistivity of 5 ohm.cm as tested by the four point method.

EXAMPLE 6.

A 10×10 mm sheet of silicon was scratched on a surface with diamond powder, placed on a carrier of circular quartz 15 mm across, and then raised to the position, in a quartz tube 48 mm across at the center.

While passing a mixed gas of 100 ml of $H_2$ and 30 ml of CO and 4 ml of $CO_2$ per minute, a 2.45 GHz microwave was transmitted from the magnetron, which was operating at 220 W, to the chamber to heat the substrate to 900° C. and, thus igniting a plasma. Pressure was maintained at about 3.3 KPa in the chamber by controlled degassing.

After 30 minutes of the mixed gas supply, the product was taken out and the peak position and half-and 20%-values of the CL spectrum were evaluated as 2.80 eV, 0.60 eV and 0.95 eV, respectively, with the latter two being too large relative to the predetermined type IIa standard. Then 5 ml of $CO_2$ was added to the gas per 100 ml of $H_2$, the process was resumed and continued 5 more hours to obtain 6 micron thick diamond film, which exhibited the values well meeting the standard, with the peak position being 2.8 eV and half- and 20%-values, 0.45 and 0.75 eV, respectively.

EXAMPLE 7.

The same arrangement as described above was used with similar substrate, which was heated to about 900° C. in a mixed gas flow of 100 ml of $H_2$ and 3 ml of $CH_4$ per minute. 30 minutes after the ignition of plasma, the product was diagnosed by CL spectrum, which exhibited a peak position of 2.80 eV, and half- and 20%-value width of 0.80 and 1.1 eV, respectively, the latter two did not meet the type IIa criteria. So 1.5 ml per minute of $O_2$ was added to the system and the three component gas was passed for 5 hours. The resulting 3 micron thick film met the standard, with the peak position and half- and 20%-width values being 2.8, 0.5 and 0.75 eV, respectively.

As described above in detail, the method of the present invention permits:

(1) to diagnose the product and, thus, process parameters at an early stage of the process, to see if the process is adequate for the desired quality. Thus time and cost can be saved by avoiding going through wasteful process until a significant mass of deposit is produced. In repeated runs it allows to check the reproducibility of process parameters.

(2) by regularly examining the deposit, to check any deviation short after it happens, so optimal process apartment can be maintained for the most part. Homogeneous products can be thus secured.

(3) to prepare a quality map by relating product evaluation results with corresponding process parameters, whereby parameter settings can be optimized.

What is claimed is:

1. A method of producing a diamond substance of predetermined acceptable quality, said predetermined acceptable quality being indicated by the cathodoluminescence spectrum of a control diamond substance having said acceptable quality comprising:

a) providing a substrate in a chemical vapor deposition chamber;

b) depositing a diamond substance on said substrate by chemical vapor deposition, said depositing comprising:
      i. introducing into said chamber a matrix gas comprising hydrogen and at least one additional gas selected from a hydrocarbon gas and carbon monoxide;
      ii. exciting said matrix gas to create a plasma while heating said substrate to a deposition temperature to deposit a diamond substance on said substrate, said substance being crystallographically diamond;

c) interrupting said deposition at an early stage after commencing said deposition for a sufficient time to deposit sufficient diamond substance to enable measurement of the luminescence spectrum of said diamond substance by cathodoluminescence;

d) removing said substrate bearing said diamond substance from said chamber;

e) subjecting said deposited diamond substance to a cathodoluminescence measurement to determine the luminescence spectrum of said deposited diamond substance;

f) comparing, utilizing the luminescence measurement of step e), the luminescence spectrum, in terms of peak position in photon energy, half-value width and 20%-value width of said deposited diamond substance with the corresponding luminescence spectrum values for a diamond substance of acceptable quality, whereby the comparison provides an indication of any deviation in said deposited diamond substance from said acceptable quality;

g) returning said substrate, bearing said deposited diamond substance, to said chemical vapor deposition chamber;

h) depositing additional diamond substance on said substrate by chemical vapor deposition according to step b); and i) adjusting, based on the comparison of step f), one or more of the pressure, substrate temperature, or matrix gas composition prevailing in the step h) to compensate for deviation from acceptable quality indicated by the comparison of step f).

2. A method to claim 1, in which said steps c) through i) are repeated to produce a significant mass of said deposited diamond substance of said acceptable quality.

3. A method according to claim 2, in which said deposition temperature in step ii is at least 700° C.

4. A method according to claim 1, in which said matrix gas comprises $H_2$ and $CH_4$, with or without additive gas or gases.

5. A method according to claim 4, in which said matrix gas comprises the system of $H_2$ and $CH_4$, with the $CH_4$ content being 1 part or more by volume relative to 100 parts to $H_2$.

6. A method according to claim 5, in which said matrix gas further comprises an oxygen-containing additive gas, with the atomic ratio of oxygen from said oxygen-containing additive gas to hydrogen being greater than 2/100.

7. A method according to claim 6, in which said additive gas comprises at least one selected from $O_2$, $CO_2$ and $H_2O$.

8. A method according to claim 7, in which said additive gas comprises 1.5 or more parts by volume of $O_2$ relative to 100 parts of $H_2$.

9. A method according to claim 7, in which said additive gas comprises 1 or more parts by volume of $CO_2$ relative to 100 parts of $H_2$.

10. A method according to claim 7, in which said additive gas comprises +2 or more parts by volume of $H_2O$ relative to 100 parts of $H_2$.

11. A method according to claim 1, in which said matrix gas comprises $H_2$ and CO, with or without additive gas or gases.

12. A method according to claim 11, in which said matrix gas comprises the system of $H_2$ and CO, with the CO content being less than 15 parts by volume relative to 100 parts of $H_2$.

13. A method according to claim 11, in which said matrix gas comprises 100 volume parts of $H_2$, 15 parts or more of CO and an oxygen-containing additive gas, with the atomic ratio of the oxygen from said oxygen-containing additive gas to hydrogen being greater than 5/100.

14. A method according to claim 13, in which said additive gas comprises at least one selected from $O_2$, $CO_2$ and $H_2O$.

15. A method according to claim 14, in which said additive gas comprises 3 or more parts by volume of $O_2$ relative to 100 parts of $H_2$.

16. A method according to claim 14, in which said additive gas comprises 5 or more parts by volume of $CO_2$ relative to 100 parts of $H_2$.

17. A method according to claim 14, in which said additive gas comprises 5 or more parts by volume of $H_2O$ relative to 100 parts of $H_2$.

18. A method according to claim 4, in which said matrix gas further comprises a dopant gas selected from $B_2H_6$, $H_2S$, $PH_3$, $AlH_3$, HCl, $AsH_3$ and $H_2Se$.

19. A method according to claim 11, in which said matrix gas further comprises a dopant gas selected from $B_2H_6$, $H_2S$, $PH_3$, $AlH_3$, HCl, $AsH_3$ and $H_2Se$.

20. A method according to claim 18, in which the product is controlled to a peak position photon energy level of 2.4 to 2.5 eV, half-value width and 20%-value width not exceeding 0.9 eV and 1.2 eV, respectively.

* * * * *